(12) United States Patent  
Shiraishi et al.

(10) Patent No.: US 6,678,849 B1  
(45) Date of Patent: Jan. 13, 2004

(54) SEMICONDUCTOR INTEGRATED CIRCUIT AND TEST PATTERN GENERATION METHOD THEREFOR

(75) Inventors: Junya Shiraishi, Tokyo (JP); Michio Komoda, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/377,037

(22) Filed: Aug. 19, 1999

(30) Foreign Application Priority Data

Mar. 12, 1999 (JP) .......................................... 11-067427

(51) Int. Cl.[7] .............................................. G01R 31/28
(52) U.S. Cl. ...................................... 714/729; 714/727
(58) Field of Search ................................ 714/726, 727, 714/729

(56) References Cited

U.S. PATENT DOCUMENTS

| | | | | |
|---|---|---|---|---|
| 4,513,418 A | * | 4/1985 | Bardell, Jr. et al. ......... | 714/726 |
| 4,872,169 A | * | 10/1989 | Whetsel, Jr. ................. | 714/727 |
| 5,056,094 A | * | 10/1991 | Whetsel ....................... | 714/736 |
| 5,130,647 A | * | 7/1992 | Sakashita et al. ........... | 714/731 |
| 5,132,974 A | * | 7/1992 | Rosales ....................... | 714/731 |
| 5,260,949 A | * | 11/1993 | Hashizume et al. ........ | 714/731 |
| 5,477,548 A | * | 12/1995 | Beenker et al. ............. | 714/727 |
| 5,502,730 A | * | 3/1996 | Roy et al. .................... | 714/726 |
| 5,592,493 A | * | 1/1997 | Crouch et al. .............. | 714/729 |
| 5,615,217 A | * | 3/1997 | Horne et al. ................ | 714/727 |

(List continued on next page.)

FOREIGN PATENT DOCUMENTS

JP          7-198783         8/1995

OTHER PUBLICATIONS

The Ballast methodology for structured partial scan design, Gupta, R.; Gupta, R.; Breuer, M.A., Computers, IEEE Transactions on , vol.: 39 Issue: 4 , Apr. 1990, p.(s): 538–544.*

Testability properties of acyclic structures and applications to partial scan design Gupta, R.; Breuer, M.A. VLSI Test Symposium, 1992. '10th Anniversary. Design, Test and Application: ASICs and Systems–on–a–Chip', Digest of Papers, 1992 IEEE, 1992 Page(s.*

Stroele, A.P. and Wunderlich, H.–J.Hardware–optimal test register insertion; IEEE Transactions on Computer–Aided Design of Integrated Circuits and Systems, vol.: 17 Issue: 6, Jun. 1998 p.(2): 531–539.*

Optimal scan for pipelined testing: an asynchronous foundation; Roncken, M.; Aarts, E.; Verhaegh, W.; Proceedings International Test Conference, 1996, p.(s): 215–224.*

Testability properties of acyclic structures and applications to partial scan design; Gupta, R.; Breuer, M.A.; VLSI Test Symposium, 1992. '10th Anniversary. Design, Test and Application: ASICs and Systems–on–a–Chip', Digest of Papers, 1992 IEEE, 1992 Page(.*

The Ballast methodology for structured partial scan design; Gupta, R.; Gupta, R.; Breuer, M.A.; IEEE Transactions on Computers, vol.: 39 Issue: 4, Apr. 1990 p.(s): 538–544.*

Ballast: a methodology for partial scan design; Gupta, R.; Gupta, R.; Breuer, M.A.; Fault–Tolerant Computing, 1989. FTCS–19. Digest of Papers, Nineteenth International Symposium on , 1989 p.(s): 118–125.*

*Primary Examiner*—David Ton
*Assistant Examiner*—Joseph D. Torres
(74) *Attorney, Agent, or Firm*—Burns, Doane, Swecker & Mathis, LLP

(57) ABSTRACT

A semiconductor integrated circuit includes a test pass and a test circuit that are placed on the way of the test pass so that a stage has the same excess value when the stage has different stage labels and different excess values in a scan chain of a stage interval n. A test pattern generation method for the semiconductor integrated circuit is also disclosed.

8 Claims, 13 Drawing Sheets

U.S. PATENT DOCUMENTS

| | | | |
|---|---|---|---|
| 5,636,228 A | * 6/1997 | Moughanni et al. | 714/726 |
| 5,642,363 A | * 6/1997 | Smith | 714/729 |
| 5,774,474 A | * 6/1998 | Narayanan et al. | 714/726 |
| 5,911,039 A | * 6/1999 | Hashizume et al. | 714/30 |
| 6,073,265 A | * 6/2000 | Komoda | 714/738 |
| 6,191,603 B1 | * 2/2001 | Muradali et al. | 324/765 |
| 6,260,165 B1 | * 7/2001 | Whetsel | 714/727 |
| 6,292,915 B1 | * 9/2001 | Hosokawa et al. | 714/726 |

* cited by examiner

EXAMPLE OF NORMAL FF

EXAMPLE OF SCAN FF

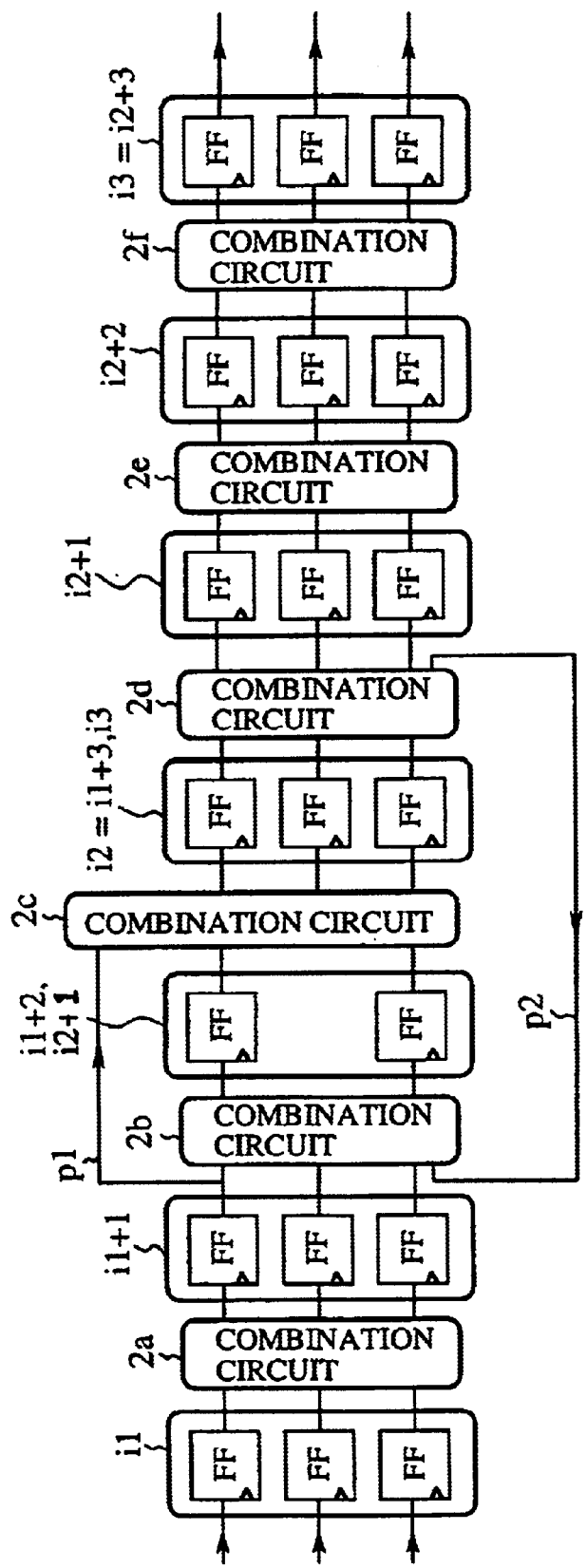

PASS DURING HOLD STATE

RELEASING FLIP FLOP WITH HOLDING FUNCTION (HFF) FROM HOLD STATE (HFF MAY INPUT DATA)

SEMICONDUCTOR INTEGRATED CIRCUIT AND TEST PATTERN GENERATION METHOD THEREFOR

BACKGROUND OF THE INVENTION

1. Field of the Invention

The present invention relates to a semiconductor integrated circuit comprising flip flops (FF) and combination circuits and a test pattern generation method for generating test patterns used for detecting faulty circuits involved in the semiconductor integrated circuit.

2. Description of the Related Art

In general, a semiconductor integrated circuit comprises a plurality of flip flops (FF) and a plurality of combination circuits. Recently, there have been strong demands to provide Large Scale Integration (LSI) circuits operable in a higher frequency in the semiconductor integrated circuit field. In order to achieve this demand, the number of flip flops and the area required for the flip flops in the semiconductor integrated circuit have increased.

FIG. 1 is a block diagram showing a part of a conventional semiconductor integrated circuit. In FIG. 1, the reference character FF designates a flip flop, 11a, 11b, 11c, 11d, and 11e denote stages. Each stage comprises a plurality of the flip flops (FF). The reference characters 2a, 2b, 2c, and 2d indicate combination circuits.

There are conventional test circuit design methods such as a full scan and a partial scan in which flip flops (FF) are replaced with scan flip flop (SFF) in order to detect faulty circuits in a plurality of the flip flops (FF) and the combination circuits, and wiring defects in the semiconductor integrated circuit. The conventional test circuit design methods use an Auto Test Pattern Generation (ATPG) to generate test patterns automatically.

FIG. 2 is an explanation circuit showing a full scan test method. In FIG. 2, the reference characters 12a, 12b, 12c, 12d, and 12e designate stages. The reference number 12 denotes a scan chain through which test patterns are transferred from an external device such as an external tester (not shown) to the scan flip flops (SFF) in each stage. That is, through the scan chain 12, the scan flip flops (SFF) in the stages 12a to 12e are connected in series. Other circuit components shown in FIG. 2 are the same as the circuit components in the semiconductor integrated circuit shown in FIG. 1. Therefore the same reference characters are used for the same components.

Next, a description will be given of the operation of the conventional test pattern generation method.

In the full scan method, the scan chain 12 is formed by connecting the scan flip flops (SFF) in the stage 12a, 12b, 12c, 12d, and 12e in series. During the scan mode, the test pattern is set into the scan flip flops (SFF) through the scan chain 12. During a normal mode after this scan mode, a clock signal is supplied so that the combination circuits 2a, 2b, 2c, and 2d input the test pattern from the scan flip flops (SFF) in each of the stages 12a, 12b, 12c, 12d, and 12e and then output the test patterns. Further, during the scan mode after this normal mode, the scan flip flops (SFF) in each stage input the test pattern from the combination circuits 2a, 2b, 2c, and 2d. After this, the external tester (not shown) monitors the test result obtained by the above test operation to detect the presence or absence of circuit defects or wiring defects in the semiconductor integrated circuit.

FIG. 3 is a flow chart showing the procedure of the full scan method.

First, the combination circuits 2a, 2b, 2c, and 2d in the semiconductor integrated circuit are extracted (Step ST131). Next, the ATPG is executed for the combination circuits 2a, 2b, 2c, and 2d (Step ST132). Since the test pattern generated by the ATPG controls the input to and output from each of the combination circuits 2a, 2b, 2c, and 2d, it cannot be directly used for the test of an actual semiconductor integrated circuit.

Next, the formatting of the test pattern generated by the ATPG is executed in order to use the test pattern for the actual semiconductor integrated circuit (Step ST133). For example, in the formatting of the test pattern used for testing of the combination circuit 2a, the test pattern is set into the scan flip flop (SFF) in the first stage 12a through the scan chain 12. After this, during the normal operation mode, the scan flip flops (SFF) in the stage 12b input the output from the combination circuit 2a during one system clock. Finally, the data stored in the scan flip flops (SFF) in the stage 12b are transferred to the external device such as the external tester (not shown) through the scan chain 12 during the scan operation mode.

In general, the above described operations are repeated required times for the formatting of the test patterns because the ATPG generates many test patterns. In this case, the test patterns may be generated only for small scale combination circuits that are divided by the scan chain 12. Accordingly, the test patterns are relatively generated and it is possible to increase the rate of the detection of faulty circuits by using the small scale test patterns.

However, the circuit area of the semiconductor integrated circuit is increased because all of the flip flops in the semiconductor integrated circuit are replaced with the scan flip flops in the full scan method. The rate of the increasing of the area is proportional to the number of the flip flops.

The difference in area between the flip flop (FF) and the scan flip flop (SFF) will be explained.

FIG. 4 is a block diagram showing a configuration of a flip flop (FF). FIG. 5 is a block diagram showing a configuration of a scan flip flop (SFF). In FIG. 4 and FIG. 5, the reference character D designates a data input line through which a data item is inputted, and SI denotes an input data line through which a scan data item is inputted. The reference character SM in FIG. 5 denotes a control line through which a control signal to set the scan flip flop (SFF) into the scan operation mode is inputted. The reference character T designates an input line through which a scan clock is inputted. This scan clock controls the operation of the scan flip flop (SFF). The reference character Q indicates an output line through which the data is outputted. The reference character QC designates an output line through which an inverted data item that is obtained by inverting the level of the data on the output line Q is outputted.

As clearly shown in FIG. 4 and FIG. 5, the scan flip flop (SFF) shown in FIG. 5 is larger in circuit size than the flip flop (FF) shown in FIG. 4. That is, the scan flip flop (SFF) shown in FIG. 5 has a larger circuit area when compared with the flip flop (FF).

Recently, there have been strong demands to provide a semiconductor integrated circuit operable in a high frequency. In order to achieve this demand, the number of stages made up of combination circuits must be decreased. Each of the combination circuits are placed between stages made up of flip flops (FF). This means an increase in the number of the flip flops (FF). Accordingly, the application of the full scan to a semiconductor integrated circuit introduces a drawback that the overhead of the circuit area in the semiconductor integrated circuit is increased because all of the flip flops (FF) must be replaced with the scan flip flops (SFFs) in the full scan.

FIG. 6 is a diagram explaining a procedure of a partial scan operation. In FIG. 6, the reference characters 16a, 16b, 16c, 16d, and 16e designate stages. The stages other than the stage 16c include both flip flops and scan flip flops. In the configuration shown in FIG. 6, all of the scan flip flop (SFF) are connected to each other through a scan chain 16. Other circuit components shown in FIG. 6 are the same of the circuit components of the semiconductor integrated circuit shown in FIG. 1. Accordingly, the same reference characters are used for the same circuit components.

Next, a description will be given of the operation of the partial scan.

FIG. 7 is a flowchart showing the procedure of the partial scan operation.

When the partial scan is executed for the target semiconductor integrated circuit shown in FIG. 1, at first, the circuit configuration of the semiconductor integrated circuit is analyzed in order to extract test points including flip flops having poor controlling and poor observation (Step ST171). Those test points are arranged in the order of the poor control.

Next, the number of the flip flops that will be replaced with the scan flip flops is determined based on a predetermined scan rate. This scan rate is a rate of the number of the flip flops to be replaced with the scan flip flops to the total number of the flip flops in the target semiconductor integrated circuit. The number of the flip flops to be replaced is obtained by multiplying the total number of the flip flops with the scan rate. Then, the flip flops in the test points are extracted according to the number of the flip flops obtained by the above multiplication. Further, the flip flops extracted are replaced with the scan flip flops (SFF) (Step ST172). Thereby, the circuit including the scan chain 16 shown in FIG. 6 is obtained.

Next, taking into consideration in the control and observation using the scan chain 16, the ATPG is executed for the circuits including the scan flip flops shown in FIG. 6 in order to generate test patterns (Step ST173). However, when compared with the full scan operation, this partial scan operation further requires the generation of other test patterns for sequential circuits such as flip flops based on the timing of a system clock because the target circuits for the ATPG includes sequential circuits such as the flip flops.

Finally, like the full scan operation, the formatting of the test patterns is executed in order to correctly set and observe the data to the parts connected through the scan chain 16 (Step ST174).

Because the partial scan operation does not require replacing all of the flip flops with the scan flip flops, it is possible to decrease the scan rate and to suppress the overhead of the circuit area of the replaced scan flip flop in the target semiconductor integrated circuit when compared with the full scan operation. However, it is difficult in a partial scan to execute the ATPG while taking into consideration of the sequential circuits such as flip flops. Accordingly, when the scan rate is decreased, the detection rate of detecting faulty circuits is also decreased. This greatly increases the number of test patterns in order to increase the detection rate to detect faulty circuits and wiring defects. In addition to this drawback, it is very difficult in function for a current engineering work station (EWS) to execute the partial scan operation for a large scale integration (LSI), because the partial scan requires to generate test patterns while taking into consideration for the sequential circuits such as flip flops.

Since the conventional test methods, the full scan method and the partial scan method, to detect faulty circuits and wiring defects in the semiconductor integrated circuit are executed based on the procedures described above, flip flops (FF) must be replaced with scan flip flops (SFF) in the full scan operation. This increases the circuit area of the semiconductor integrated circuit, namely to increase the overhead of the area of the semiconductor integrated circuit. On the other hand, because some flip flops in the semiconductor integrated circuit are replaced with scan flip flops (SFF) in the partial scan operation, it is possible to suppress the overhead of the area of the semiconductor integrated circuit, but it becomes difficult to execute the ATPG while taking into consideration of the sequential circuits such as the flip flops. For example, the partial scan decreases the rate of the detection of faulty circuits and increases the number of test patterns when the scan rate is decreased. In addition, because the partial scan must generate the test patterns while taking into consideration of the sequential circuits such as flip flops, it is required to generate the test patterns while considering the entire circuit configuration of the semiconductor integrated circuit. It is therefor difficult in function for the current engineering work station (EWS) to execute the partial scan for the large scale integration (LSI).

SUMMARY OF THE INVENTION

Accordingly, an object of the present invention is, with due consideration to the drawbacks of the conventional technique, to provide a semiconductor integrated circuit and a test pattern generation method therefor, whose configuration and method are capable of suppressing the overhead of the area and detecting faulty circuits and wiring defects with a high detection rate, and introduce easy generation of test patterns. That is to say, the ATPG may be easily executed, In accordance with a preferred embodiment of the present invention, a semiconductor integrated circuit comprises a plurality of stages, each stage including a plurality of flip flops, and every nth stages being connected to each other to form a scan chain for a scan test, where n is an integer, a plurality of combination circuits respectively placed among said plurality of stages, a first test path connected between said plurality of stages so as to ensure that a given stage is assigned a plurality of stage labels such that integer subscripts respectively constituting said plurality of stage labels produce the same remainder when divided by the integer n, and a first test circuit placed on said first test path, said first test circuit selectively actuating said first test path in a scan test.

In accordance with another preferred embodiment of the present invention, a test pattern generation method for a semiconductor integrated circuit, comprises the steps of: assigning a plurality of stage labels to each of a plurality of stages constituting the semiconductor integrated circuit, a plurality of flip flops constituting each of said plurality of stages and every nth stages being connected to each other to form a scan chain for a scan test, where n is an integer; inserting a first test path connecting said plurality of stages so as to ensure that a given stage is assigned a plurality of stage labels such that integer subscripts respectively constituting said plurality of stage labels produce the same remainder when divided by the integer n; inserting a first test circuit on the first test path, said first test circuit selectively actuating said first test path in a scan test; replacing said plurality of flip flops in said given stage forming said chain with scan flip flops; and generating test patterns for combination circuits placed between said plurality of stages.

BRIEF DESCRIPTION OF THE DRAWINGS

These and other objects, features, aspects and advantages of the present invention will become more apparent from the following detailed description of the present invention when taken in conjunction with the accompanying drawings, in which:

FIG. 12 is a block diagram showing a semiconductor integrated circuit;

DESCRIPTION OF THE PREFERRED EMBODIMENTS

Other features of this invention will become apparent through the following description of preferred embodiments which are given for illustration of the invention and are not intended to be limiting thereof.

First Embodiment

First, a pipeline scan method that is the basic concept to be applied to the semiconductor integrated circuit and test pattern generation method according to the present invention will be explained and then explain the configuration of the semiconductor integrated circuit as a synchronous design circuit and the test pattern generation method as the preferred embodiments.

The pipeline scan method as the basic concept of the present invention can eliminate the conventional drawbacks caused by the test methods such as the full scan method and the partial scan method. That is, the conventional drawbacks are as follows:

Increasing the overhead of the circuit area caused by executing the full scan method; and The difficulty in the generation of test patterns to detect faulty circuits in the semiconductor integrated circuit in the partial scan method.

In the pipeline configuration of a semiconductor integrated circuit such as synchronous design circuits, a plurality of stages are arranged and each stage is made up of one or more flip flops (FF) and a combination circuit. For example, the combination circuit in the i1 stage (i1 is an optional positive integer) inputs data transferred from a plurality of flip flops forming this i1 stage and must output the data to a plurality of flip flops in a following stage in a downstream.

In general, a stage in the synchronous design circuit has a pair of the group of the flip flops and a combination circuit. In order to easily explain the features of the present invention, the group of the flip flops will be called a stage in the following descriptions of the first to third embodiments.

Figure 8:
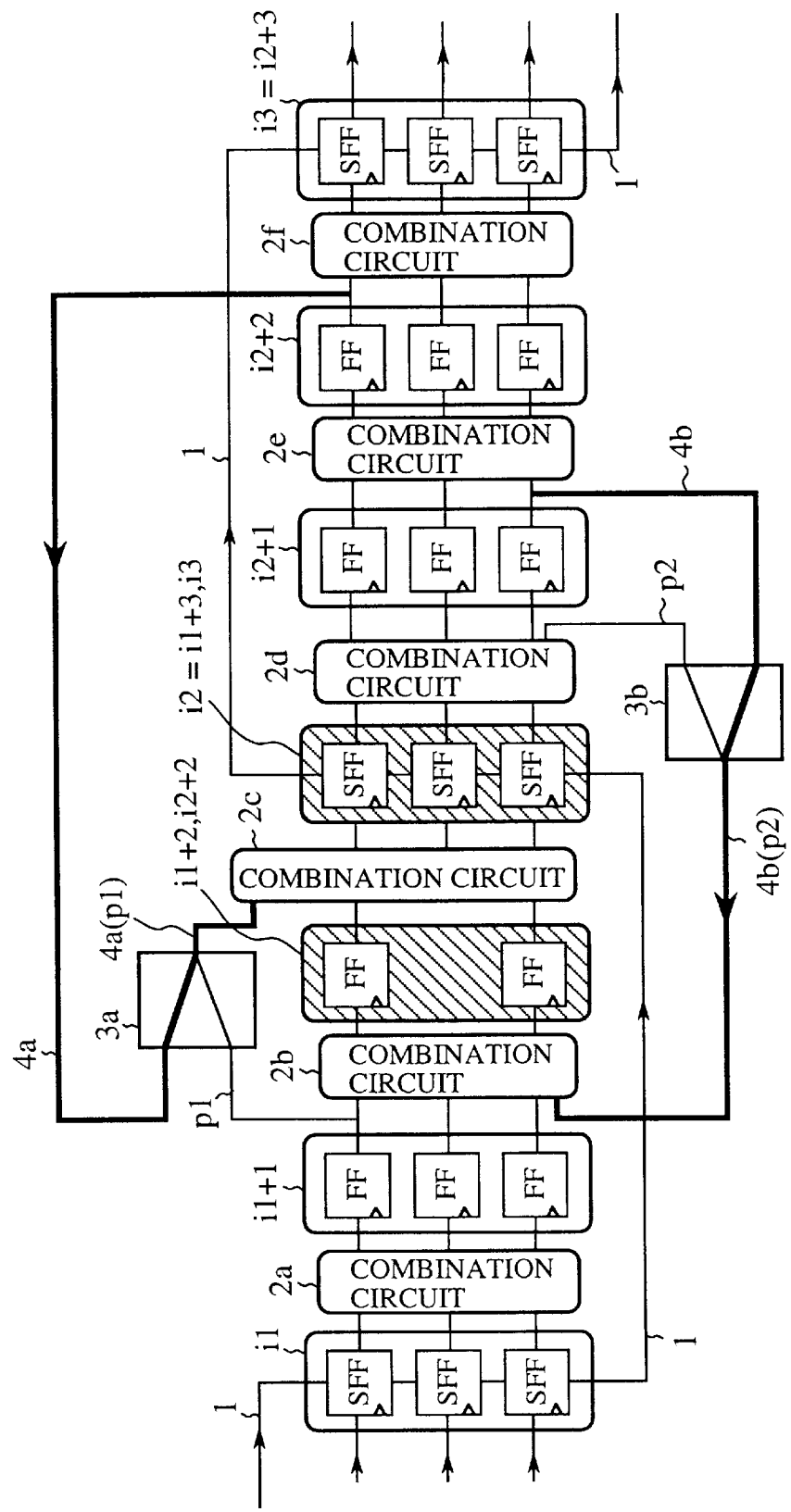
FIG. 8 is a block diagram showing a configuration of a semiconductor integrated circuit according to the first embodiment of the present invention.

FIG. 8 is a block diagram showing a configuration of the semiconductor integrated circuit according to the first embodiment of the present invention. For example, in the semiconductor integrated circuit shown in FIG. 8, the stage i1 is made up of three scan flip flops (SFF), and the stage (i1+1) is made up of three flip flops (FF). Further a stage number and a stage label are denoted by the same symbol (for example, i+1) in the following description unless otherwise specified.

Figure 1:
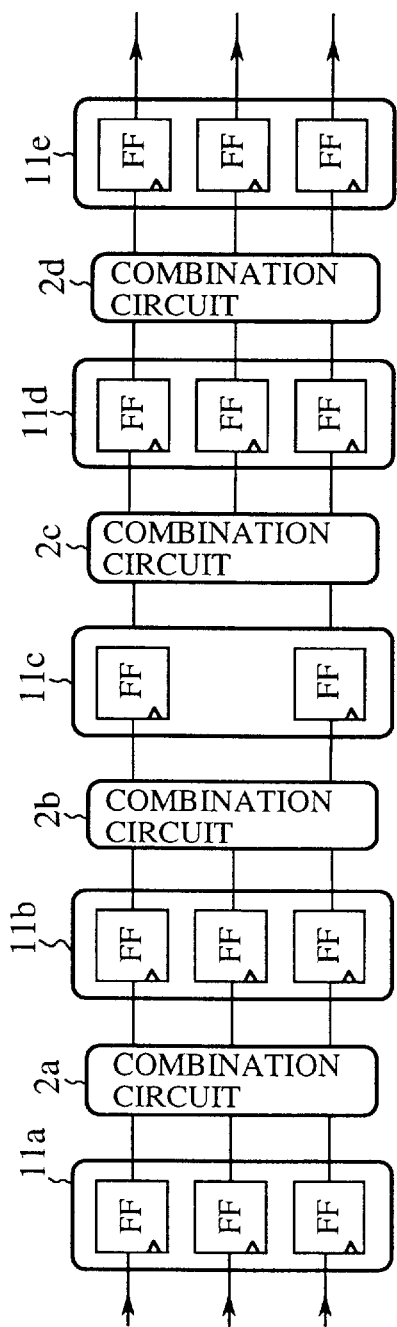
FIG. 1 is a block diagram showing a part of a conventional semiconductor integrated circuit.

The semiconductor integrated circuit as a synchronous design circuit shown in FIG. 1 has a pipeline structure in circuit configuration. Most semiconductor integrated circuits capable of executing high-speed arithmetic operation has the pipeline structure shown in FIG. 1. In the pipeline scan method, stages occurring at a constant interval of n (n is a positive integer) in the semiconductor integrated circuit shown in FIG. 1 are scanned. These stages are serially connected to each other through a scan chain or scan path. That is, the pipeline scan method is one of the partial scan methods because the flip flops (FF) in some stages in, instead of all of the stages, in the semiconductor integrated circuit are serially connected to form the scan chain.

Figure 9:
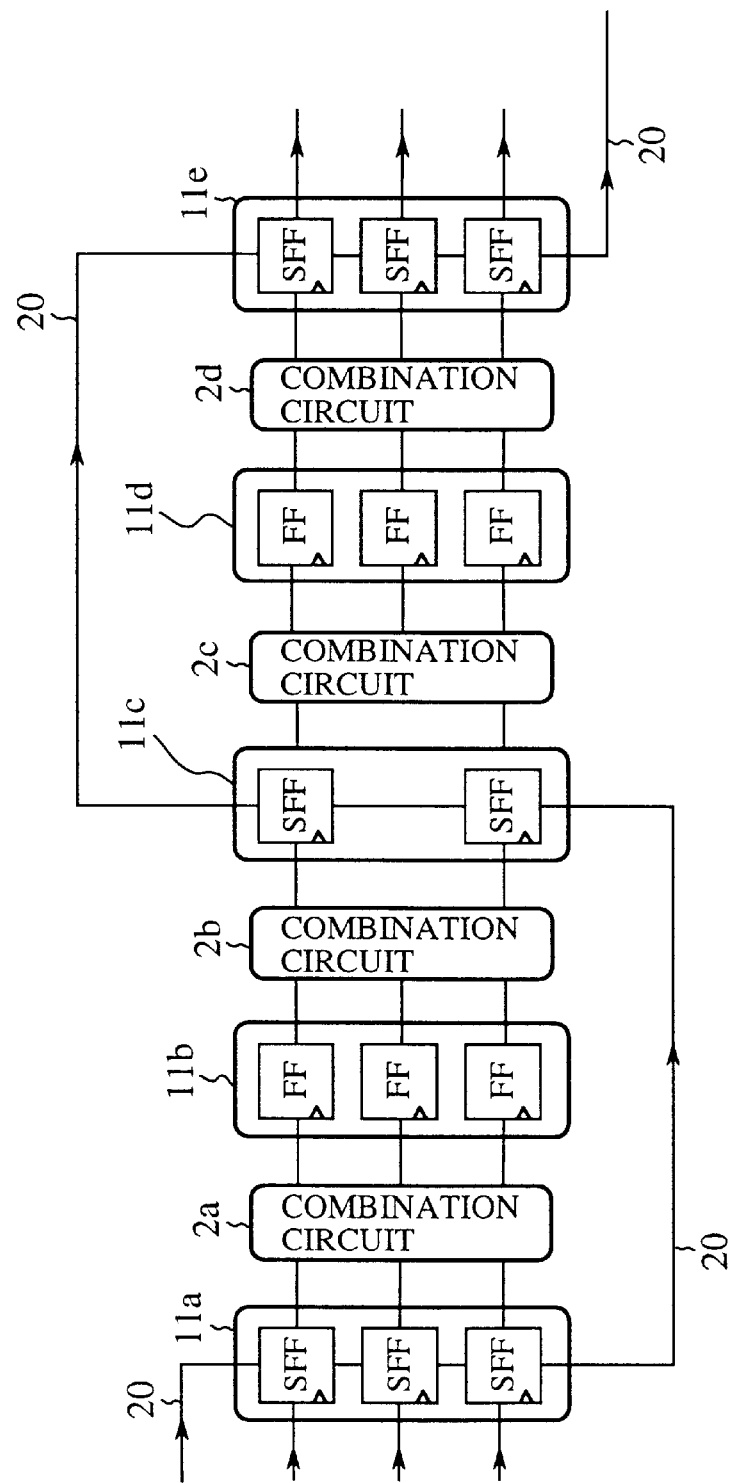
FIG. 9 is a block diagram showing the semiconductor integrated circuit in which a plurality of stages form a scan chain of a constant stage interval n=2.

FIG. 9 is a block diagram showing the semiconductor integrated circuit in which a plurality of stages form a scan chain of a constant stage interval n=2. In FIG. 9, the reference characters 11a to 11e designate stages. Each stage is made up of either scan flip flops (SFF) or flip flops (FF). The reference characters 2a to 2d denote combination circuits and the reference number 20 indicates a scan chain.

Figure 10:
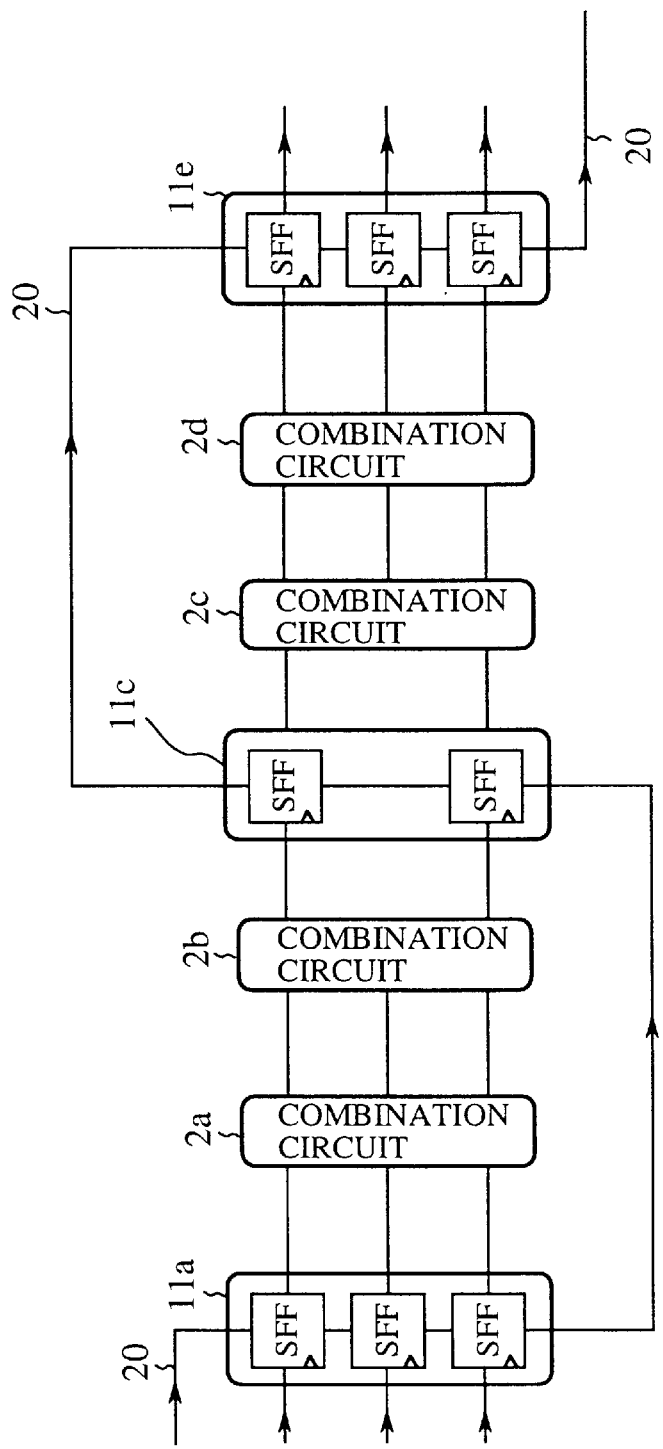
FIG. 10 is a block diagram showing the semiconductor integrated circuit in which un-scanned stages are eliminated.

FIG. 10 is a block diagram showing a configuration of the semiconductor integrated circuit in which un-scanned stages are eliminated. That is, FIG. 10 shows an equivalent circuit of the circuit shown in FIG. 9. The configuration shown in FIG. 10 is obtained by eliminating the stages 11b and 11d from the configuration shown in FIG. 9.

During the generation of test patterns, the stage 11a outputs data items directly to the combination circuit 2a and the stage 11c inputs data items directly from the combination circuit 2b.

Figure 2:
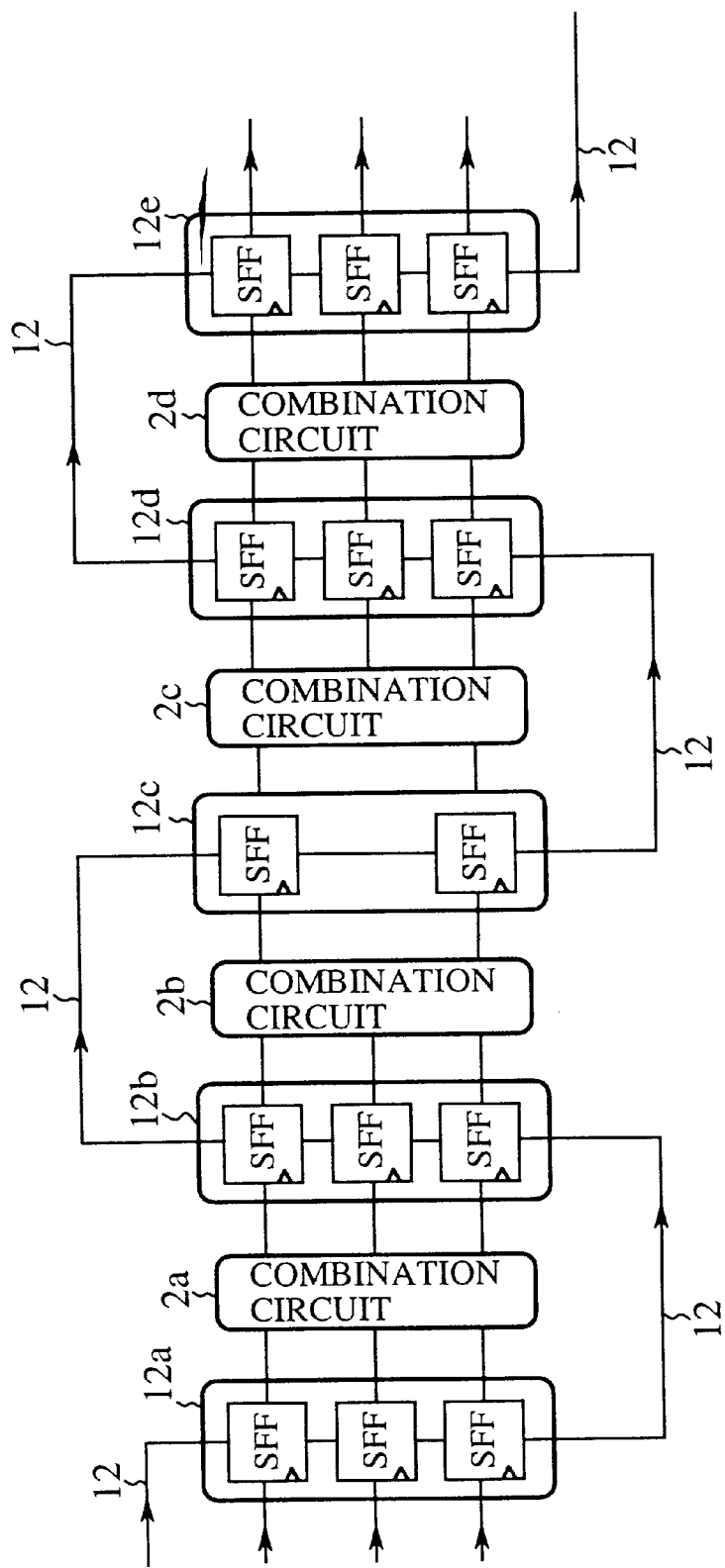
FIG. 2 is an explanation circuit showing a conventional full scan test method.
Figure 3:
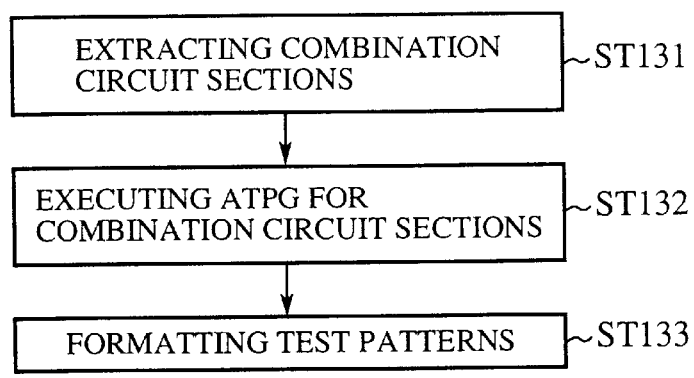
FIG. 3 is a flow chart showing the procedure of the full scan method.
Figure 4:
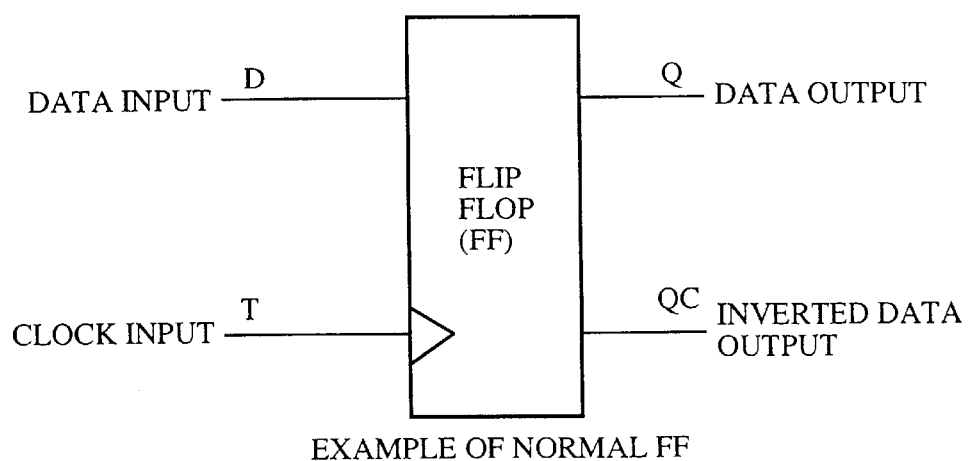
FIG. 4 is a block diagram showing a configuration of a flip flop (FF).
Figure 5:
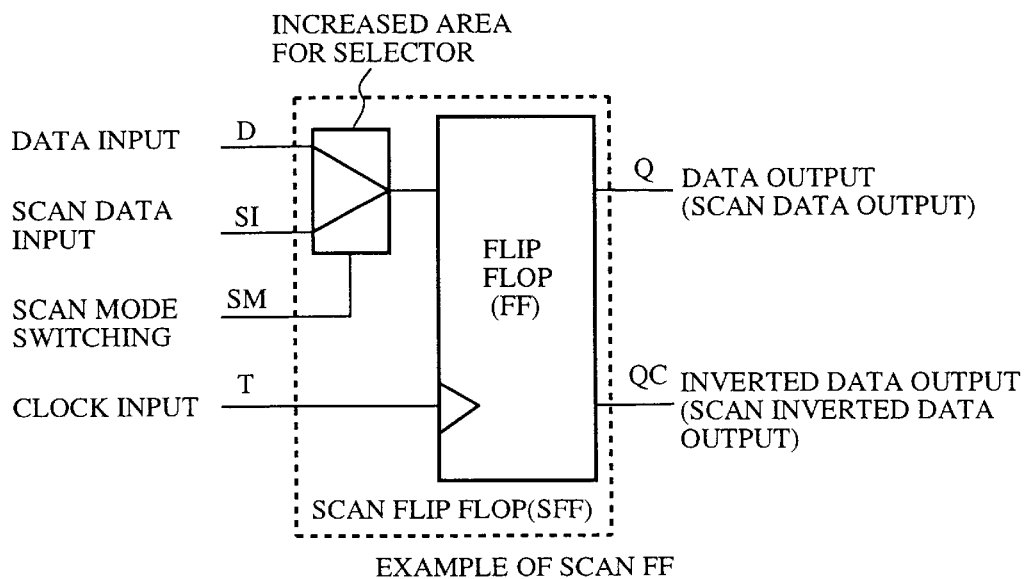
FIG. 5 is a block diagram showing a configuration of a scan flip flop (SFF).
Figure 7:
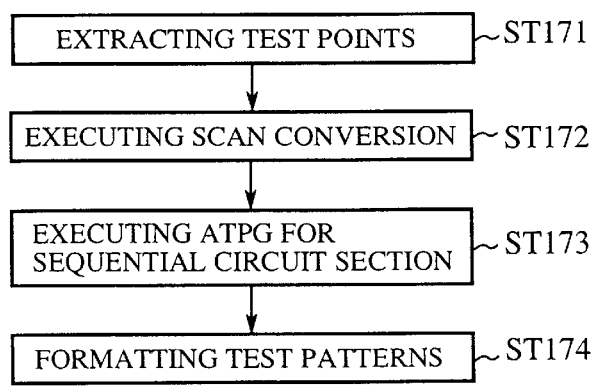
FIG. 7 is a flowchart showing the procedure of the partial scan operation.
Figure 6:
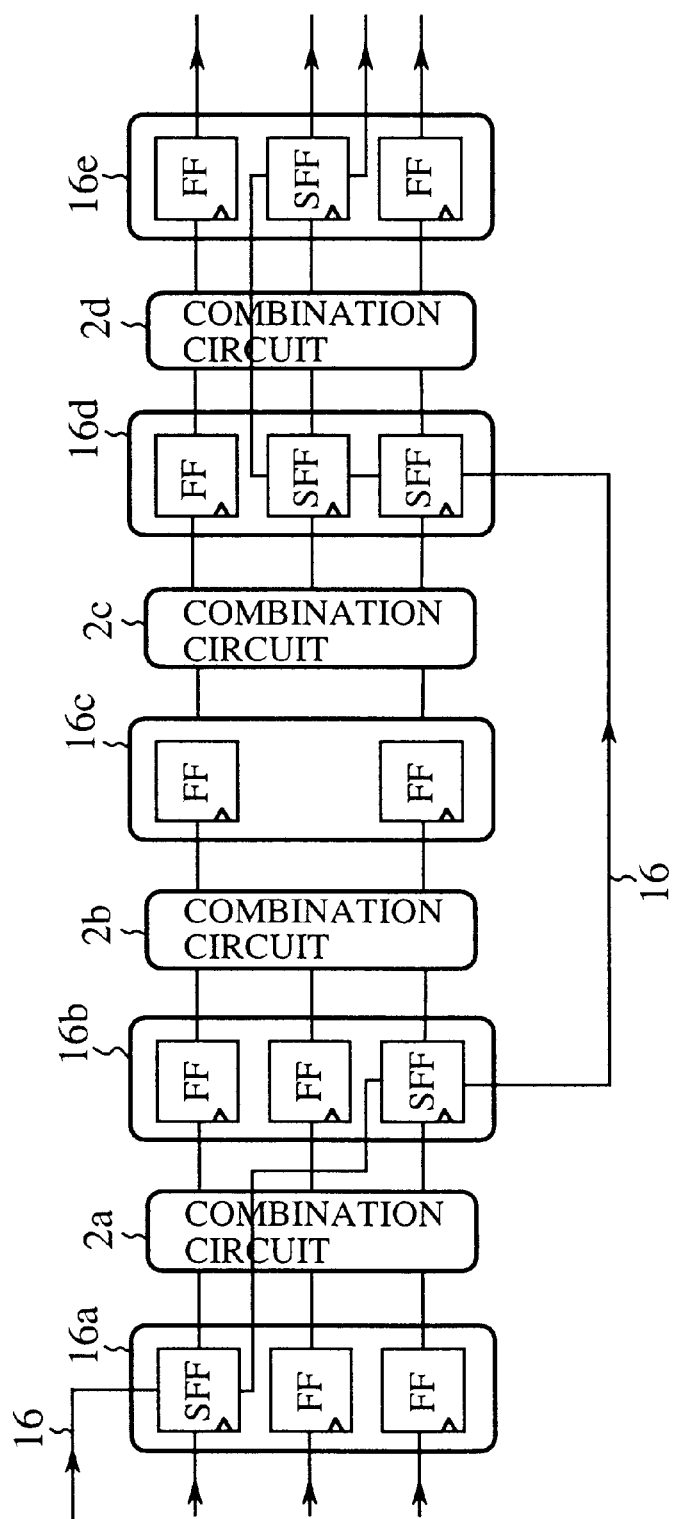
FIG. 6 is a diagram explaining a procedure of a partial scan operation.

Because the configuration of the pipeline structure shown in FIG. 10 is equivalent to the configuration of the circuit based on the full scan method shown in FIG. 2, it is possible to use the Auto Test Pattern Generation (ATPG) for generating test patterns for the circuit shown in FIG. 10.

Figure 11:
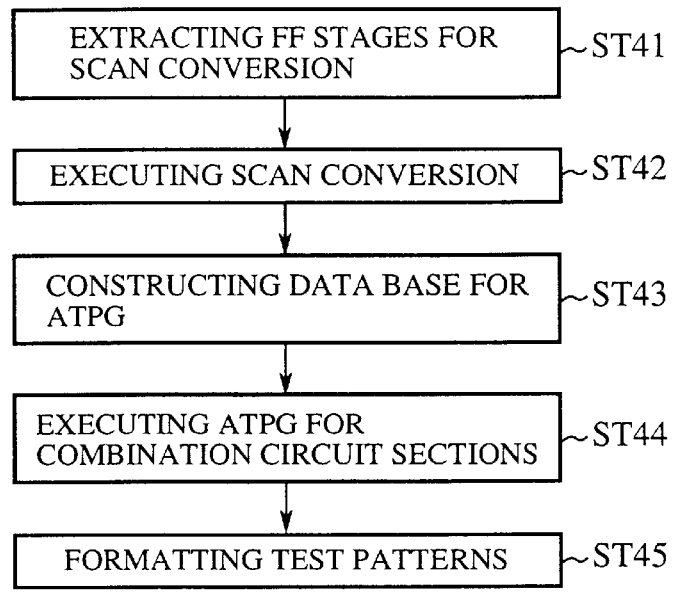
FIG. 11 is a flow chart showing procedures of a pipeline scan.

FIG. 11 is a flow chart showing procedures of the pipeline scan.

First, the stages 11a, 11c, and 11e are extracted from the configuration of the semiconductor integrated circuit shown in FIG. 1 (Step ST41). These stages 11a, 11c, and 11e are target stages for the scan operation.

Next, the flip flops (FF) in the extracted stages 11a, 11c, and 11e are replaced with scan flip flops (SFF) (Step ST42). After this process, a data base for ATPG is formed in a memory (not shown) and then test patterns are stored into the data base in the memory (Step ST43).

Next, the ATPG is executed in order to generate test patterns for combination circuits 2a to 2d (Step ST44). After this, the formatting of the test patterns is executed (Step ST45). Because this formatting is equal to the formatting of the full scan mode, the detailed explanation is omitted here.

Accordingly, by using the pipeline scan method as the concept of the present invention, it is easily possible to generate the test patterns of a small scale having a higher detection rate to detect faulty circuits in the semiconductor integrated circuit. While the test operation in the pipeline scan mode is performed, some additional system clocks are required only for transferring data between flip flops in the stages 11b and 11d that are not scanned, in addition to the input of the clock used during the full scan mode. It is thereby possible to correctly transfer the test patterns from a previous stage to a following stage.

Although the pipeline scan method as the concept of the present invention described above can be applied to a semiconductor integrated circuit having a complete pipeline structure shown in FIG. 1, the pipeline scan method is capable of reducing the overhead of the circuit area in the semiconductor integrated circuit and executing the ATPG for the flip flops and the combination circuits at the same time. The pipeline scan can eliminate the drawbacks involved in the full scan method and the partial scan method that are conventionally used.

In the following descriptions about the semiconductor integrated circuits and the test pattern generation methods as the first to third embodiments according to the present invention, the pipeline scan method having the above feature will be applied to various types of semiconductor integrated circuits as the synchronous design circuit having configurations other than the pipeline structure.

FIG. 12 is a block diagram showing a semiconductor integrated circuit as the synchronous design circuit. In FIG. 12, the reference characters i1, i1+1, i1+2, i2, i2+1, i2+2, and i3 designate stages. Each stage includes two or three flip flops (FF). The reference characters 2a to 2f denote combination circuits. The reference characters p1 and p2 indicate data passes. Thus, the semiconductor integrated circuit shown in FIG. 12 comprises a plurality of the flip flops (FF) and the combination circuits 2a to 2f.

Figure 13:
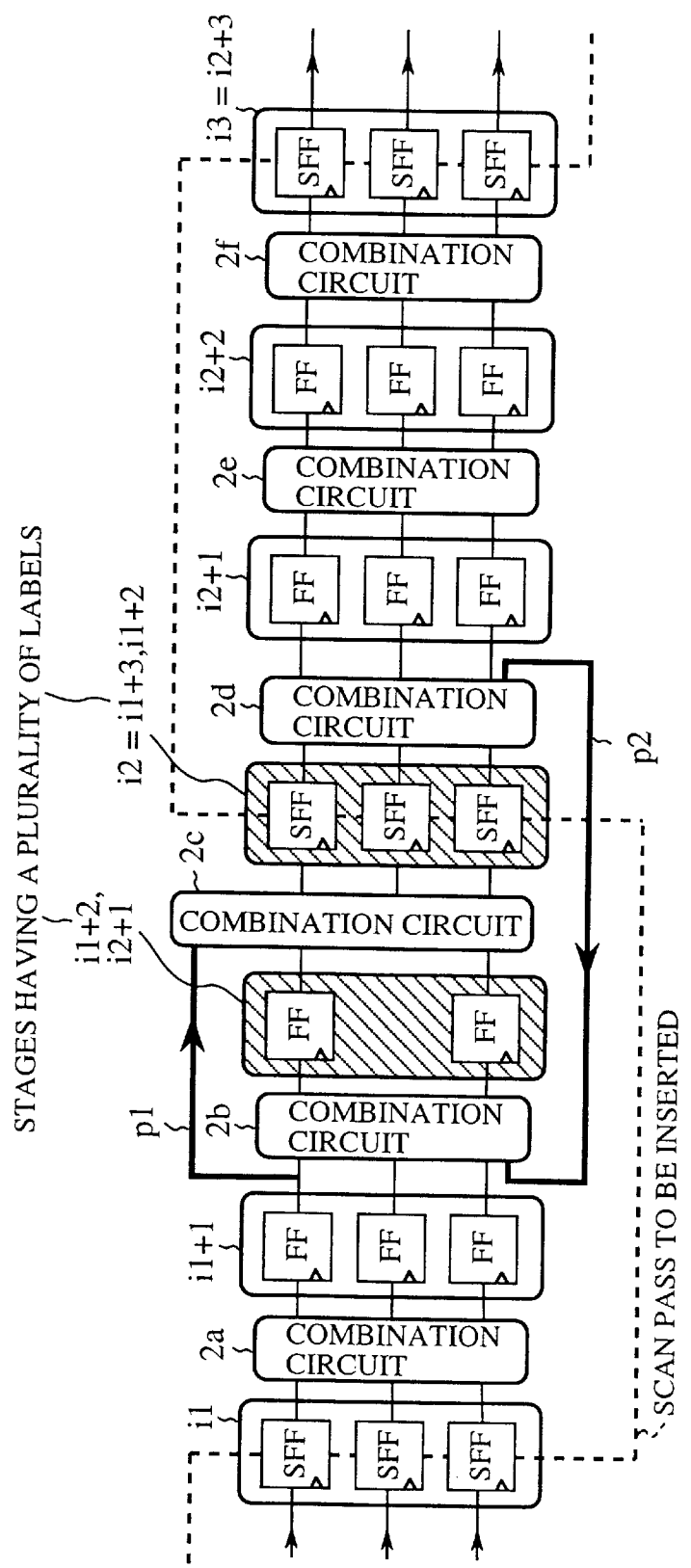
FIG. 13 is a diagram for explaining a scanned semiconductor integrated circuit in which each stage is labeled.

FIG. 13 is a diagram for explaining the scanned semiconductor integrated circuit in which each stage is labeled. In FIG. 13, the reference characters i1, i1+1, i1+2, i2+1, i2+2, and i3 designate the stage labels. Those stage labels also mean the stages. The reference characters 2a to 2f denote the combination circuits. The reference characters p1 and p2 indicate the data passes. The dotted line indicates a scan chain or a scan pass to be inserted into the stages. In the semiconductor integrated circuit shown in FIG. 13, the scan chain indicated by the dotted line is constructed per n=3 stage interval.

FIG. 8 is the block diagram showing the configuration of the semiconductor integrated circuit as the first embodiment of the present invention. In FIG. 8, the reference characters i1, i1+1, i2+1, i2+2, and i3 designate the stage labels.

Similarly, the reference characters i1+2 or i2+2, i2=i1+3 and i3 indicate the stages, namely the stage labels. The reference number 1 designates a scan chain, 2a to 2f denote the combination circuits, 3a and 3b denote test circuits comprising circuit elements such as selectors, and 4a and 4b designate test passes that are activated when the test circuits 3a and 3b turn ON during the scan test mode. In activation state of the test circuits 3a and 3b, the test data are transferred through the test paths 4a and 4b.

Next, a description will be given of the operation of the pipeline scan method.

When the scan chain having the stage interval n=3 is constructed by applying the pipeline scan method to the semiconductor integrated circuit having the configuration shown in FIG. 12, there are the stages to which two or more stage labels are given based on the presence of the pass p1 and the feedback pass p2, as shown in FIG. 13. That is, there are the stages, each stage having the two stage labels (i1+2, i2+1) and (i2=i1+3, i1+2). Through the data pass p1, data are transferred from the stage i1+1 to the combination circuit 2c. Further, through the feedback pass p2, data are transferred from the combination circuit 2d to the combination circuit 2b.

Accordingly, because the semiconductor integrated circuit shown in FIG. 13 does not have a complete pipeline structure, it is impossible to apply the pipeline scan method directly to the structure shown in FIG. 13 and also possible to generate test patterns for the combination circuits. That is, it may happen that the test pattern transferred from the upper stream can not be transferred to the scan flip flop in the down stream within same clock cycles. In other words, it is impossible to apply to the configuration shown in FIG. 13 the pipeline scan method in which the ATPG for the combination circuits is executed while neglecting the presence of the flip flops (FF) in the un-scanned stage that is not scanned.

In order to eliminate the above problem, the test circuit 3a is inserted in the data path p1 that forms uncompleted pipeline structure shown in both FIG. 12 and FIG. 13, and the test path 4a is also inserted between the stage (i2+2) and the combination circuit 2c. This test circuit 3a is activated and used only during the scan test operation. Similarly, the test circuit 3b is also inserted on the way of the data path p2 as the feedback path that forms un-completed feedback pipeline shown in both FIG. 12, and the test path 4b is also inserted between the stage (i2+1) and the combination circuit 2b. This test circuit 4a is activated and used only during the scan test operation.

The data can be thereby transferred through the test passes 4a and 4b by entering both the test circuits 3a and 3b into the ON state during the scan test operation. In this case, the stage (i1+2) shown in FIG. 8 has a new stage label (i2+2). Similarly, the stage (i2=i1+3) shown in FIG. 8 has a new stage label i3.

By turning the test circuits 3a, 3b on so that the additional test paths 4a, 4b are utilized, stage (i1+2) is assigned a new stage label (i2+2) and stage (i2=i1+3) is assigned a new stage label i3 while a test is being conducted. The integer subscripts respectively attached to a plurality of stage labels assigned to the same stage produce the same remainder when divided by the stage interval (in this case, 3). More specifically, the integer subscript (=2) constituting the stage label (i1+2) produces a remainder of 2 when divided by 3 (=stage interval). The integer subscript (=2) constituting the stage label (i2+2) also produces the remainder of 2 when divided by 3. By assigning stage labels as described above, it is ensured that a test pattern input from the SFFs of a given upstream stage constituting a scan chain is captured by (transferred to) the SFFs of a downstream stage also constituting the scan chain with the same number of clocks irrespective of whether the transfer occurs in the semiconductor integrated circuit. Accordingly, the pipeline scan method, whereby flip flops in the interposed stages not constituting the scan chain are ignored in generating the ATPG, is successfully employed.

This means that the pipeline scan method can be applied to a semiconductor integrated circuit as a target even if the semiconductor integrated circuit does not have a pipeline structure.

A description will be given of the test procedure of the pipeline scan method capable of having the small overhead of the area of the target semiconductor integrated circuit and the high detection rate to detect faulty circuits and wiring defects.

Figure 14:
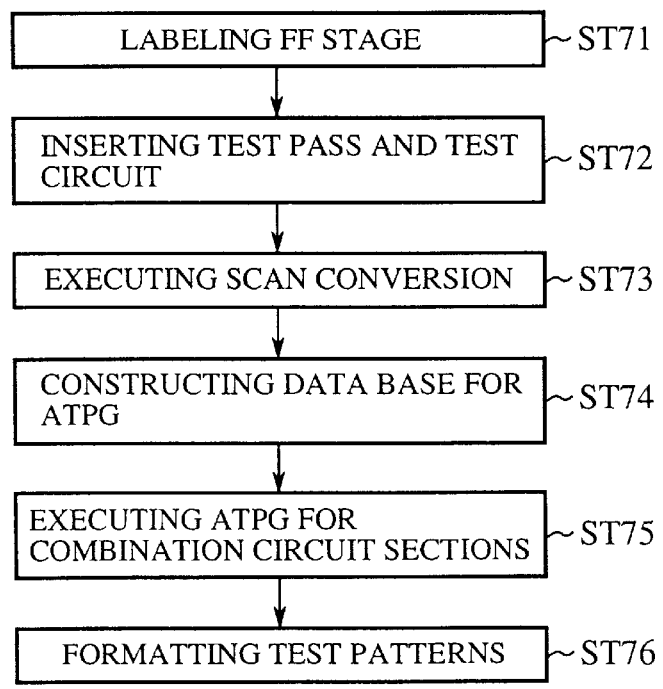
FIG. 14 is a flow chart showing a test pattern generation method for the semiconductor integrated circuit as the first embodiment shown in FIG. 8.

FIG. 14 is a flowchart showing the test pattern generation method for the semiconductor integrated circuit as the first embodiment shown in FIG. 8.

First, a stage label is given for each stage in the target semiconductor integrated circuit. That is, the labeling is executed (Step ST71).

As has already been described, in general, although each stage in a semiconductor integrated circuit as a synchronous design circuit is made up of a pair of a group of flip flops (FF) and a combination circuit, in the following descriptions for the first to three embodiments, the group of flip flops (FF) will be called to as a stage for briefly explanation.

Next, a stage interval n (n is a positive integer) is determined in order to form the scan chain. A test path is then inserted for stages having a plurality of stage labels so that each stage has the same excess value. For example, when the stage interval n is n=3, the remainder are 0, 1, and 2. A test circuit is also inserted on the way of the test paths (Step ST72).

Next, flip flops in the stages forming the scan chain are replaced with scan flip flops (SFF) (Step ST73). The ATPG is then executed in order to construct a data base of test patterns. Specifically, the generated test patterns are stored into the data base formed in a memory such as a RAM (not shown).

Next, the ATPG is executed for combination circuits (Step ST75). The formatting of the test patterns is then executed (Step ST76). Thereby, the test patterns obtained are monitored by an external tester (not shown) in order to detect the presence of faulty circuits in the target semiconductor integrated circuit. Thereby, the pipeline scan operation is completed.

As described above, according to the first embodiment, each stage in a target semiconductor integrated circuit is labeled, and when the stages with a plurality of stage labels have different excess values, test circuits and test paths are inserted among these stages so that these stages have the same excess value. Therefore it is possible to apply the pipeline scan method, having the function of a small overhead of the area and a high detection rate of faulty circuits, to the semiconductor integrated circuit that has not a pipeline structure.

Second Embodiment

Figure 15:
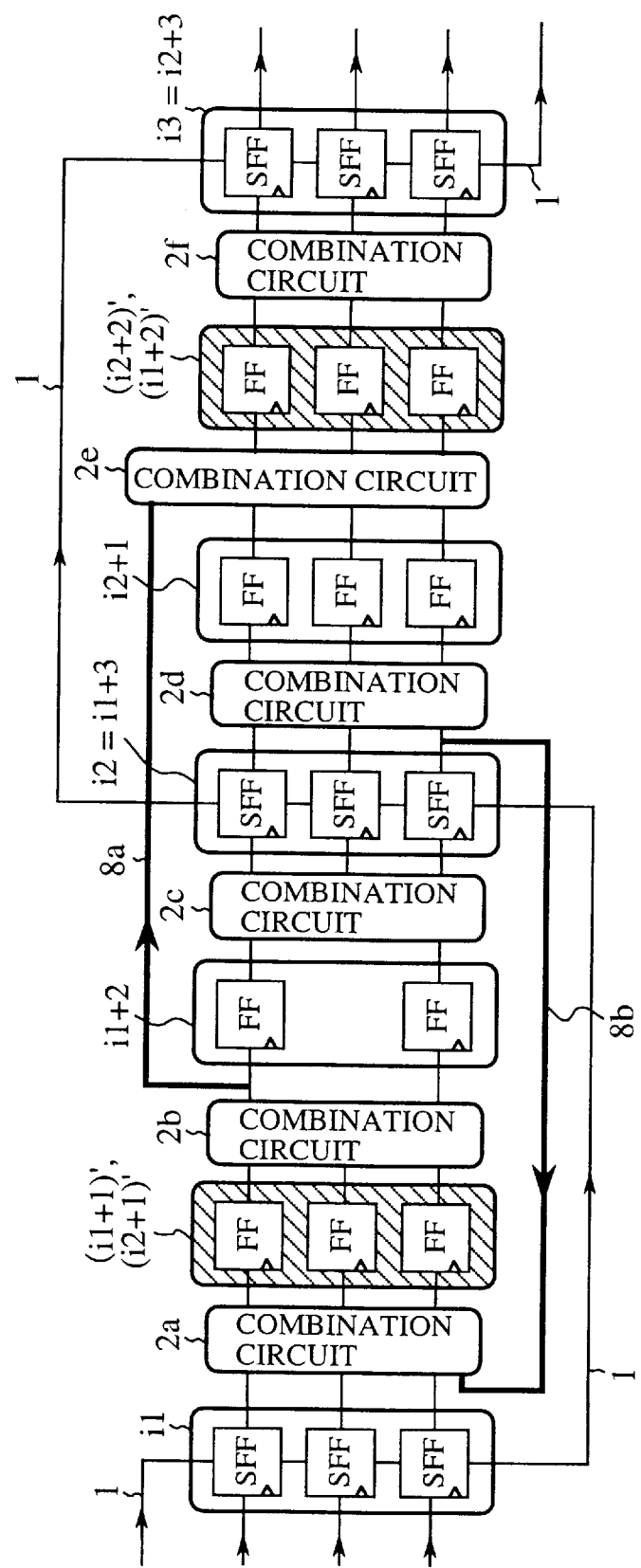
FIG. 15 is a block diagram showing a semiconductor integrated circuit according to the second embodiment of the present invention.

FIG. 15 is a block diagram showing the semiconductor integrated circuit according to the second embodiment of the present invention. In FIG. 15, the reference characters (i+1)', (i2+1)', (i2+2)', (i1+2)' designate labels, namely, stage labels. Other components are the same as the components in the semiconductor integrated circuit of the first embodiment, therefore, the same reference characters are used for the same components.

Next, a description will be given of the operation of the second embodiment.

In the first embodiment, the ATPG of the combination circuits can be used by inserting the test circuits 3a and 3b and the test paths 4a and 4b for the stages having a plurality of stage labels and different stage labels.

There is a case in which stages have the same excess values as the result of the labeling to the stages in the semiconductor integrated circuit. For example, as shown in FIG. 15, the stages (i1+1)', (i2+1)', (i2+2)', (i1+2)' have the same excess value. In this case, when a test circuit is inserted (for example, at the Step ST72 shown in FIG. 14), the stages having the same excess value are extracted and then the test circuits and the test passes are not given to those stages. It is thereby possible to execute the ATPG for the combination circuits like the first embodiment, because it is possible to transfer data within the same clock cycles to the flip flops (FF) in the stages that are not scanned, namely are not connected through the scan chain. This increases the area of the semiconductor integrated circuit by the area required for the test circuits and the test passes.

As described above, according to the second embodiment, the stages having the same excess value are extracted from the stages, each of which has a plurality of stage labels, and the test circuit and the test pass are not given to the extracted stages. It is therefore possible to suppress the increasing of the area in the semiconductor integrated circuit required for the test circuit and the test pass that are not given to those stages.

Third Embodiment

Figure 16:
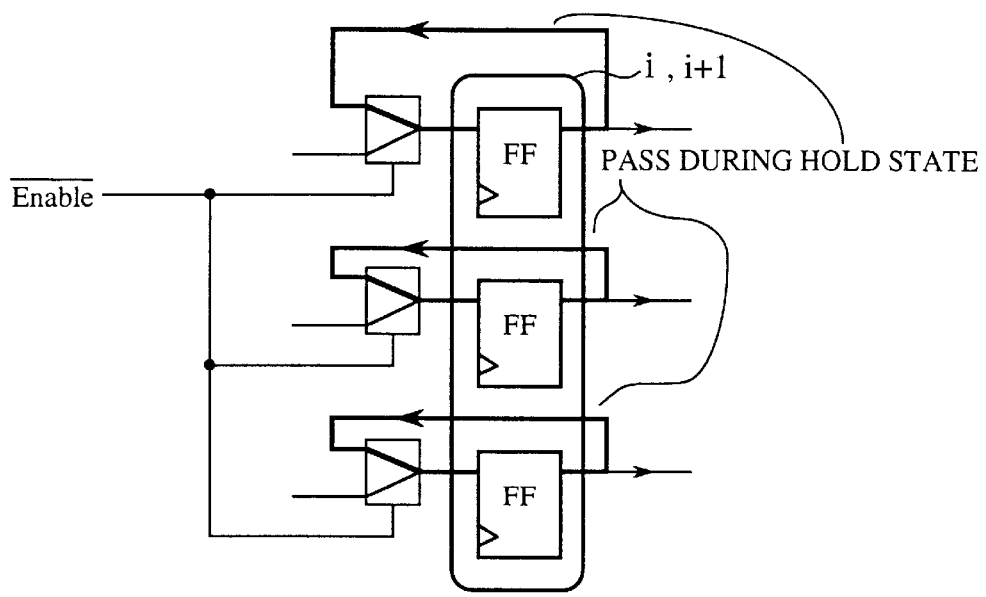
FIG. 16 is a block diagram showing a part of the semiconductor integrated circuit.
Figure 17:
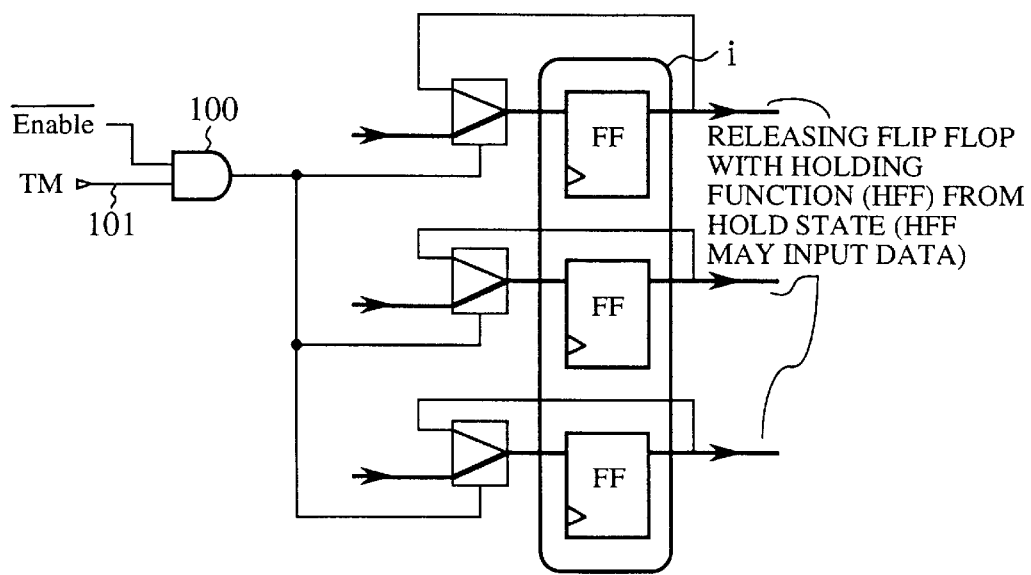
FIG. 17 is a block diagram showing a part of the semiconductor integrated circuit according to the third embodiment of the present invention.

FIG. 16 is a block diagram showing a part of the semiconductor integrated circuit and FIG. 17 is a block diagram showing a part of the semiconductor integrated circuit according to the third embodiment of the present invention.

In FIG. 16 and FIG. 17, the reference characters i and i+1 designates a stage or a stage label given to the stage, and HFF denotes a flip flop with a hold function capable of holding data. The reference number 100 designates a test circuit, and 101 designates a test pass. Thus, FIG. 16 and FIG. 17 show a part of the semiconductor integrated circuit.

Next, a description will be given of the operation of the third embodiment.

As shown in FIG. 16, in the semiconductor integrated circuit including a stage made up of the flip flops (HFF) having the holding function, the stage has different stage labels i and i+1 when the labeling (Step ST71 shown in FIG. 14) is executed. That is, as shown by the solid line in FIG. 16, the feedback pass is formed when the hold function in the flip flop (HFF) turns ON by supplying an enable signal/ Enable. This gives different stage labels to the stage made up of the flip flops (HFF) with the hold function. Therefore it is impossible to execute the ATPG for the combination circuits.

In order to eliminate this problem, when the test circuit and the test passes are inserted in the Step ST72 shown in FIG. 14, the test circuit 100 and the test pass 101 are inserted for the flip flops (HFF) with the hold function shown in FIG. 17. the enable signal/Enable as a control signal is supplied through the test pass 101 to the test circuit 100 so that the hold function of each of the flip flops (HFF) is released during the execution of the scan test operation. That is, the hold function in each of the flip flops (HFF) is disabled by inputting the enable signal/Enable. In this case, the flip flops (HFF) with the hold function perform in function as a normal flip flop that can input data.

As described above, according to the third embodiment, even if the stage is made up of the flip flops (HFF) with the hold function and the stage has a plurality of stage labels and different excess values, the test pass and the test circuit are inserted so that the hold function of the flip flops is disabled during the scan test operation. It is therefore possible to apply the pipeline scan method having the feature of the small overhead in circuit area and a high detection rate of faulty circuits and wiring defects to the semiconductor integrated circuit including the flip flops (HFF) with the hold function.

As described above in detail, according to the present invention, when stages have a plurality of stage labels and different excess values after the labeling operation for each stage in a target semiconductor integrated circuit, test circuits and test pass are inserted among these stages so that these stages have the same excess value. Therefore it is possible to apply the pipeline scan method, having the function of the small overhead of the circuit area and the high detection rate of faulty circuits and wiring defects, to the semiconductor integrated circuit even if the semiconductor integrated circuit has not a pipeline structure.

In addition, according to the present invention, the stages, each having a plurality of stage labels and the same excess value, are extracted from the entire stages in the semiconductor integrated circuit, and the test circuit and the test pass are not given to the extracted stages. It is therefore possible to further suppress the increasing of the circuit area in the semiconductor integrated circuit required for the test circuit and the test pass that are not given to those stages.

Furthermore, according to the present invention, even if a stage is made up of the flip flops (HFF) with the hold function and the stage has a plurality of stage labels and different excess values, the test pass and the test circuit is inserted so that the hold function is disabled during the scan test operation. It is therefore possible to apply the pipeline scan method having the feature of the low overhead in circuit area and a high detection rate to detect faulty circuits and wiring defects to the target semiconductor integrated circuit including the flip flops (HFF) with the hold function.

While the above provides a full and complete disclosure of the preferred embodiments of the present invention, various modifications, alternate constructions and equivalents may be employed without departing from the scope of the invention. Therefore the above description and illustration should not be construed as limiting the scope of the invention, which is defined by the appended claims.

What is claimed is:

1. A semiconductor integrated circuit comprising:
   a plurality of m stages, each stage including a plurality of flip flops, and every nth stage of said plurality of m stages being connected to each other to form a scan chain for a scan test, where m and n are integers and m is greater than n;
   a plurality of combination circuits respectively placed among said plurality of stages, wherein at least one of said plurality of combination circuits includes a feedback or skip path from another of said plurality of combination circuits, and said at least one of said plurality of combination circuits is in one of a plurality of groups as a feedback/skip combination circuit, each of the groups including (1) an nth stage and (2) combination circuits and stages coupled between the nth stage and next nth stage;
   at least one test path, in the scan test, each test path being connected between an input of the feedback/skip combination circuit and an output of one of the m stages in a group other than the group including said feedback/skip combination circuit, said one of the m stages corresponding, in sequential order in a group, to another of the m stages in said group including the feedback/skip combination circuit, said another of the m stages being connected to inputs of the feedback/skip combination circuit, to compensate for the presence of said feedback or skip path; and
   at least one test circuit placed on said at least one test path, said at least one test circuit selectively actuating said at least one test path in a scan test.

2. The semiconductor integrated circuit according to claim 1, wherein neither said at least one test path nor said at least one test circuit is connected to a given combination circuit of said plurality of combination circuits when the given combination circuit includes a feedback or skip path connected to a corresponding one of the m stages in one of the groups other than the group including the given combination circuit.

3. The semiconductor integrated circuit according to claim 2, wherein when a given stage is provided with at least one flip flop with a hold function and receives data from a feedback path, a second test path and a second test circuit are coupled to the flip flop with the hold function so that, in a scan test, said second test path and said second test circuit operate to disable the hold function.

4. The semiconductor integrated circuit according to claim 1, wherein when a given stage is provided with at least one flip flop with a hold function and receives data from a feedback path, a second test path and a second test circuit are coupled to the flip flop with the hold function so that, in a scan test, said second test path and said second test circuit operate to disable the hold function.

5. A test pattern generation method for a semiconductor integrated circuit, comprising the steps of:
   providing a plurality of m stages, each stage including a plurality of flip flops, and connecting every nth stage of said plurality of m stages to each other to form a scan chain for a scan test, where m and n are integers and m is greater than n;
   providing a plurality of combination circuits respectively placed among said plurality of m stages, wherein at least one of said plurality of combination circuits includes a feedback or skip path from another of said plurality of combination circuits, and said at least one of said plurality of combination circuits is in one of groups as a feedback/skip combination circuit, each of a plurality of the groups including (1) an nth stage and (2) combination circuits and stages coupled between the nth stage and next nth stage;
   providing at least one test path, in the scan test, each test path being connected between an input of the feedback/skip combination circuit and an output of one of the m stages in a group other than the group including said feedback/skip combination circuit, said one of the m stages corresponding, in sequential order in a group, to another of the m stages in said group including the feedback/skip combination circuit, said another of the m stages being connected to inputs of the feedback/skip combination circuit, to compensate for the presence of said feedback or skip path; and providing at least one test circuit placed on said at least one test path, said at least one test circuit selectively actuating said at least one test path in a scan test.

6. The test pattern generation method according to claim 5, further comprising providing at least one given stage with at least one flip flop with a hold function which receives data from a feedback path, coupling a second test path and a second test circuit to the flip flop with the hold function so that, in a scan test, said second test path and said second test circuit operate to disable the hold function.

7. A test pattern generation method for a semiconductor integrated circuit, comprising the steps of:

a) providing a plurality m of stages, each stage including a plurality of flip flops;

b) providing a plurality of combination circuits respectively placed among said plurality of m stages, wherein at least one of said plurality of combination circuits includes a feedback or skip path from another of said plurality of combination circuits;

c) connecting every nth stage of said plurality of stages to each other to form a scan chain for a scan test, m and n being integers wherein m is greater than n;

d) replacing said plurality of flip flops in stages in the nth stages in said scan chain with scan flip flops;

e) inserting at least one test path, in the scan test, each test path being connected between an input of the combination circuit including the feedback or skip path and an output of one of the m stages in one of a plurality of groups, each of the groups including (1) nth stage and (2) the combination circuits and stages coupled between the nth stage and next nth stage, said combination circuit including the feedback or skip path being included in a group other than the group including said one of the m stages, said one of the m stages corresponding, in sequential order, to another of the m stages in said group including said combination circuit including the feedback or skip path, said another of the m stages being connected to inputs of said combination circuit including the feedback or skip path, to compensate for the presence of said feedback or skip path;

f) inserting at least one test circuit placed on said at least one test path, said at least one test circuit selectively actuating said at least one test path in a scan test; and g) generating test patterns for combination circuits placed between said plurality of stages.

8. The test pattern generation method according to claim 7, further comprising providing at least one given stage with at least one flip flop with a hold function which receives data from a feedback path, coupling a second test path and a second test circuit to the flip flop with the hold function so that, in a scan test, said second test path and said second test circuit operate to disable the hold function.

* * * * *